(12) United States Patent
Caffee et al.

(10) Patent No.: US 10,498,352 B1
(45) Date of Patent: Dec. 3, 2019

(54) CAPACITATIVE DIGITAL-TO-ANALOG CONVERTER WITH REDUCED DATA-DEPENDENT LOADING OF VOLTAGE REFERENCE

(71) Applicant: Silicon Laboratories Inc., Austin, TX (US)

(72) Inventors: Aaron J. Caffee, Scappoose, OR (US); Brian G. Drost, Corvallis, OR (US); Volodymyr Kratyuk, Hillsboro, OR (US)

(73) Assignee: Silicon Laboratories Inc., Austin, TX (US)

( * ) Notice: Subject to any disclaimer, the term of this patent is extended or adjusted under 35 U.S.C. 154(b) by 0 days.

(21) Appl. No.: 16/020,358

(22) Filed: Jun. 27, 2018

(51) Int. Cl.
*H03M 1/82* (2006.01)
*H03M 1/80* (2006.01)
*H03K 5/135* (2006.01)

(52) U.S. Cl.
CPC .............. *H03M 1/82* (2013.01); *H03K 5/135* (2013.01); *H03M 1/806* (2013.01)

(58) Field of Classification Search
CPC ......... H03M 1/82; H03M 1/806; H03K 5/135
USPC .................................................. 341/144, 150
See application file for complete search history.

(56) References Cited

U.S. PATENT DOCUMENTS

| | | | | |
|---|---|---|---|---|
| 9,223,332 B1 * | 12/2015 | Himmelbauer | ........... | G05F 3/02 |
| 9,362,936 B1 | 6/2016 | Caffee et al. | | |
| 9,531,394 B1 | 12/2016 | Caffee et al. | | |
| 9,654,135 B2 * | 5/2017 | Miki | .................. | H03M 1/0626 |
| 10,135,457 B2 * | 11/2018 | Chang | ................ | H03M 1/0682 |
| 10,270,459 B2 * | 4/2019 | Fan | ....................... | H03M 1/002 |

* cited by examiner

*Primary Examiner* — Brian K Young
(74) *Attorney, Agent, or Firm* — Zagorin Cave LLP

(57) ABSTRACT

A method for reducing data-dependent loading on a voltage reference pre-charges a capacitor of the capacitive digital-to-analog converter to configure the capacitor in a pre-charged state during a first interval. The method selectively discharges the capacitor from the pre-charged state according to a value of an input digital signal to configure the capacitor in a selectively discharged state during a second interval. The method holds an output node of the capacitive digital-to-analog converter at a reset voltage level during the first interval and the second interval. The output node is coupled to a first terminal of the capacitor. The method discharges any remaining charge on the capacitor and providing an output voltage signal to an output node of the capacitive digital-to-analog converter according to the selectively discharged state during a third interval. The output voltage signal has a voltage level corresponding to a value of the input digital signal.

19 Claims, 4 Drawing Sheets

US 10,498,352 B1

CAPACITATIVE DIGITAL-TO-ANALOG CONVERTER WITH REDUCED DATA-DEPENDENT LOADING OF VOLTAGE REFERENCE

BACKGROUND

Field of the Invention

This application is related to data converters and more particularly to digital-to-analog converters.

Description of the Related Art

Referring to FIGS. 1-3, digital-to-time converter 100 generates output signal STOP having an edge that is delayed with respect to an edge of signal START. The delay has a duration that is programmable according to input digital code $D_{IN}$. Digital-to-analog converter 102 uses reference voltage $v_{REF}$ to generate analog signal IN having a voltage level that corresponds to input digital code $D_{IN}$. Time-to-voltage converter 104 uses the voltage level of analog signal IN as an initial capacitor voltage level for capacitor 302. Time-to-voltage converter 104 charges capacitor 302 to the voltage level indicated by input signal IN during a reset interval (e.g., signal RESET='1' and signal START='0'). A start event (e.g., a rising edge of signal START) causes time-to-voltage converter 104 to enter a charging interval (e.g., RESET='0' and SLEW='1') to charge capacitor 302 using constant current $I_{SLEW}$ provided by current source 306, to cause voltage $v_{OUT}$ across capacitor 302 to increase linearly with time. Time-to-voltage converter 104 provides voltage $v_{OUT}$ to comparator 106, which is a conventional comparator circuit. Comparator 106 detects when voltage your crosses a threshold voltage level $v_{TH}$ and generates a transition (e.g., a rising edge) of signal STOP. The delay between the rising edge of signal START and a corresponding rising edge of signal STOP has a delay that is, under ideal conditions, linearly related to the level of input digital code $D_{IN}$. The evaluation interval, which includes the reset interval, charging interval, and hold interval typically repeat periodically.

FIGS. 4 and 5 illustrate a conventional capacitive digital-to-analog converter. Capacitive digital-to-analog converter 102 receives input digital code $D_{IN}$ having N input bits (e.g., $b_0, b_1, b_2, \ldots, b_{N-1}$), where N is an integer greater than or equal to one. Capacitive digital-to-analog converter 102 includes a separate capacitive digital-to-analog converter (e.g., capacitive bit cell 502) for each bit $b_n$ of the N bits of input digital code $D_{IN}$. During the reset interval, capacitive digital-to-analog converter 102 charges node 520 to a predetermined reset voltage level $v_{RESET}$. In response to deassertion of the reset signal, capacitive digital-to-analog converter 102 applies a shift voltage to node 520 according to input digital code $D_{IN}$. The output voltage $v_{OUT}$ shifts from $v_{RESET}$ to $v_{RESET} - \Delta v_{DAC}'$.

Capacitive digital-to-analog converter 102 selectively configures each bit cell 502 according to a corresponding input bit $b_n$. If input bit $b_n$ has a low logic value (i.e., $b_n$='0'), then corresponding capacitive bit cell 502 provides constant control signals to the switches to decouple the capacitive bit cell from positive voltage reference node $v_{REF+}$, and to couple the capacitive bit cell to the negative voltage reference node $v_{REF-}$, thereby discharging the switched-capacitor node.

If $b_n$ has a high logic value (i.e., $b_n$='1'), then corresponding capacitive bit cell 502 selects signal CHARGE to couple switched-capacitor node $sc_n$ to the positive voltage reference node $v_{REF+}$ during a first interval and selects signal SHIFT to selectively couple switched-capacitor node $sc_n$ to the negative voltage reference node $v_{REF-}$ during a second interval. Signal CHARGE and signal SHIFT charge switched-capacitor node $sc_n$ to voltage $v_{REF}$ in a first interval (CHARGE='1' and SHIFT='0'), thereby pre-charging switched-capacitor node $sc_n$ to a pre-charge voltage. During a second interval, signal CHARGE and signal SHIFT are configured to (CHARGE='0' and SHIFT='1') shift the voltage on switched-capacitor node $sc_n$ to a second voltage $v_{RESET} - \Delta v_{DAC}'$. As a result of selectively pre-charging switched-capacitor node $sc_n$ of each bit cell and shifting the voltage on node 520 according to the selective pre-charging, $$\Delta v_{DAC}' = (v_{REF+} - v_{REF-}) \times C_T / (C_T + C_{OUT}),$$

where $C_T$ is the sum of capacitances $C_n$ for each bit cell having $b_n$='1'. As a result, voltage $v_{OUT}$ becomes $v_{RESET} - \Delta v_{DAC}'$, which is an analog value corresponding to the value of input digital code $D_{IN}$.

If capacitive digital-to-analog converter 102 receives a repetitive digital input code, the number of digital-to-analog converter capacitor units being recharged in each cycle sets a DC bias condition on a voltage reference circuit coupled to capacitive digital-to-analog converter 102. Data-dependent changes to the voltage reference circuit affect the voltage level provided to capacitive digital-to-analog converter 102, voltage $v_{OUT}$, and performance of an application including capacitive digital-to-analog converter 102.

In an exemplary application, digital-to-time converter 100 includes capacitive digital-to-analog converter 102 in an interpolative divider. As the number of capacitor units used to generate the target delay through a digital-to-time converter increases, the loading on the associated voltage reference circuit increases. When the interpolative divider receives a near-integer divide value, the voltage reference circuit could switch from biasing conditions dwelling at a minimum digital input code to servicing a current dwelling at a maximum digital input code, causing a significant change to the load on the voltage reference circuit. The significant change to the load on the voltage reference circuit may cause a droop in the voltage level provided to capacitive digital-to-analog converter 102 and nonlinear delay generation in digital-to-time converter 100 until the voltage reference circuit adjusts to the newly established load current. Accordingly, improved techniques for capacitive digital-to-analog conversion are desired.

SUMMARY OF EMBODIMENTS OF THE INVENTION

In at least one embodiment of the invention, a method for reducing data-dependent loading on a voltage reference by a capacitive digital-to-analog converter includes pre-charging a capacitor of the capacitive digital-to-analog converter to configure the capacitor in a pre-charged state during a first interval. The method includes selectively discharging the capacitor from the pre-charged state according to a value of an input digital signal to configure the capacitor in a selectively discharged state during a second interval. The method includes holding an output node of the capacitive digital-to-analog converter at a reset voltage level during the first interval and the second interval. The output node is coupled to a first terminal of the capacitor. The method includes discharging any remaining charge on the capacitor and providing an output voltage signal to an output node of the capacitive digital-to-analog converter according to the selectively discharged state during a third interval. The output voltage signal has a voltage level corresponding to a value of the input digital signal.

In at least one embodiment of the invention, a circuit includes a capacitive digital-to-analog converter configured to convert a digital input code into an output analog signal. The capacitive digital-to-analog converter includes an output node, a reset voltage node, a first voltage reference node, a second voltage reference node, a switch coupled between the output node and the reset voltage node, and a switched-capacitor circuit. The switched-capacitor circuit includes a capacitor having a first terminal and a second terminal. The first terminal is coupled to the output node. The switch and the switched-capacitor circuit are responsive to control signals that configure the switch and the switched-capacitor circuit to couple the second terminal of the capacitor to the first voltage reference node during a first interval, selectively couple the second terminal of the capacitor to the first voltage reference node or the second voltage reference node in response to an input digital signal of the digital input code during a second interval, couple the second terminal of the capacitor to the second voltage reference node during a third interval, and couple the output node to the reset voltage node during the first interval and the second interval. During the third interval, an output analog signal on the output node is configured to have level corresponding to the digital input code.

In at least one embodiment of the invention, a method reduces data-dependent loading on a voltage reference by a capacitive digital-to-analog converter. The method includes periodically updating an output analog signal based on an input digital signal having a range of digital values. The periodically updating includes drawing a predetermined amount of charge by a capacitive digital-to-analog converter from a voltage reference node in each capacitive digital-to-analog conversion period in response to any value of the input digital signal in the range of digital values.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DETAILED DESCRIPTION

A technique reduces or eliminates data-dependent loading by a capacitive digital-to-analog converter on a voltage reference. The technique partitions a conversion period into a pre-charge interval, a selective discharge interval, and a shift interval. The resulting operation causes a voltage reference to deliver substantially the same amount of charge to the capacitive digital-to-analog converter during each conversion period, independent from the input data value. That is, over each conversion period, the capacitive digital-to-analog converter provides a constant average load to the voltage reference. The reduction in data-dependent loading improves jitter performance of timing circuits including the capacitive digital-to-analog converter and improves near-integer divide values by interpolative dividers, in particular.

Figure 6:
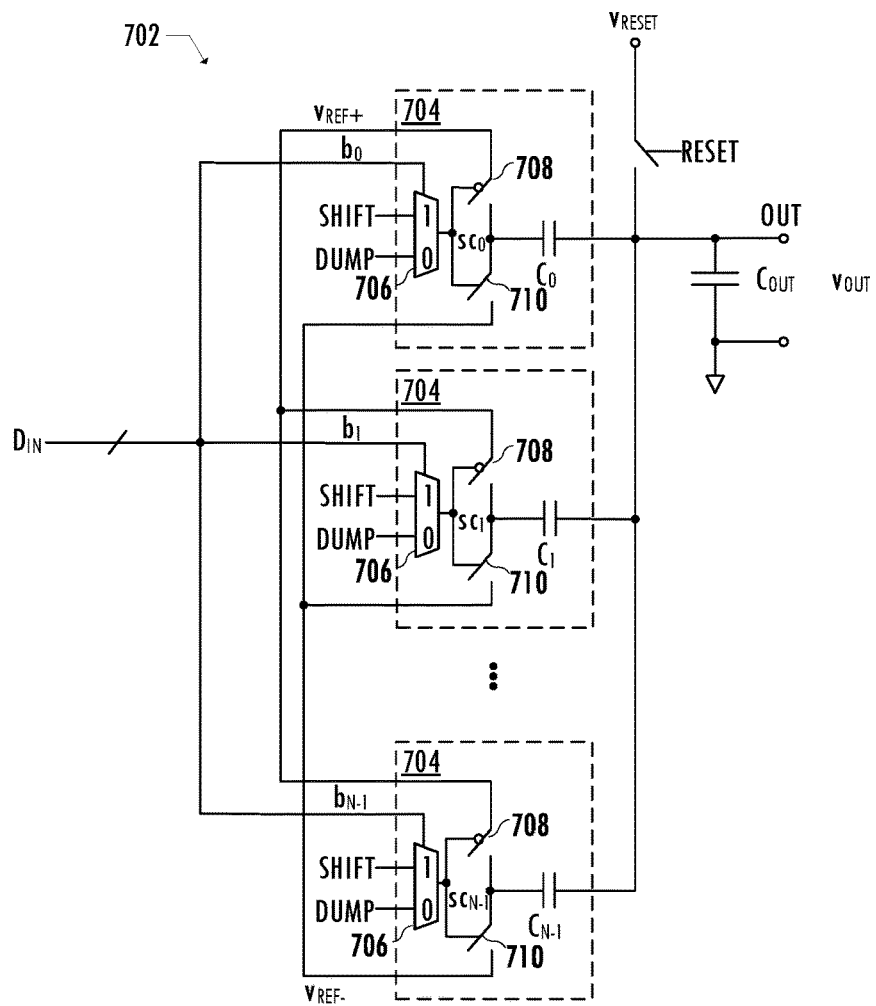
FIG. 6 illustrates a circuit diagram of an exemplary capacitive digital-to-analog converter having reduced data-dependency of loading of the voltage reference circuit consistent with at least one embodiment of the invention.
Figure 7:
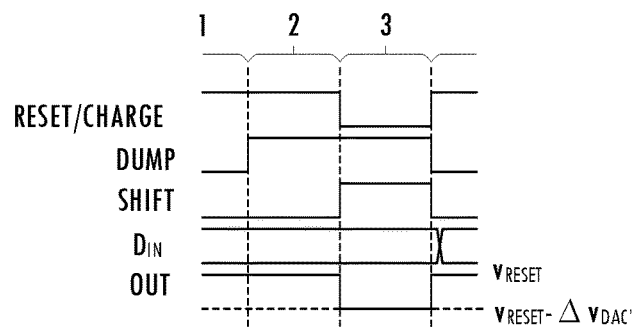
FIG. 7 illustrates exemplary waveforms for the capacitive digital-to-analog converter having reduced data-dependency of loading the voltage reference circuit of FIG. 6.

Referring to FIGS. 6 and 7, capacitive digital-to-analog converter 702 receives input digital code $D_{IN}$ having N input bits (e.g., $b_0$, $b_1$, $b_2$, $b_{N-1}$), where N is an integer greater than or equal to one. Capacitive digital-to-analog converter 702 includes a unit capacitive digital-to-analog converter (e.g., capacitive bit cell 704) for each bit of the N bits of input digital code $D_{IN}$. During the entire reset interval (e.g., RESET='1'), which spans interval 1 (i.e., a pre-charge interval) and interval 2 (i.e., a selective discharge interval), capacitive digital-to-analog converter 702 charges node 720 to a predetermined reset voltage $v_{RESET}$. Each capacitive bit cell 704 configures a corresponding select circuit 706 according to a corresponding input bit $b_n$. If the corresponding input bit $b_n$ has a low logic value (i.e., $b_n$='0'), then capacitive bit cell 704 provides a charge dump enable signal to switch 708 and to switch 710 coupled to positive voltage reference node $v_{REF+}$ and negative voltage reference node $v_{REF-}$, respectively.

During interval 1 of the digital-to-analog conversion period (e.g., RESET='1,' DUMP='0,' and SHIFT='0'), capacitive bit cell 704 closes switch 708 and opens switch 710, thereby coupling switched-capacitor node $sc_n$ to positive voltage reference node and pre-charging switched-capacitor node $sc_n$ to positive voltage $v_{REF+}$. During interval 2 of the digital-to-analog conversion period (e.g., RESET='1,' DUMP='1,' and SHIFT='0'), capacitive bit cell 704 selectively discharges switched-capacitor node $sc_n$ according to the value of input bit $b_n$, e.g., closes switch 708 and selectively opens switch 710 according to the corresponding input bit $b_n$. If input bit $b_n$ has a low logic value (i.e., $b_n$='0'), then select circuit 706 provides signal DUMP, which opens switch 708 during the second portion of the reset interval and closes switch 710 during the second portion of the reset interval, thereby coupling switched-capacitor node $sc_n$ to negative voltage reference node $v_{REF-}$ and dis-charging switched-capacitor node $sc_n$ to negative voltage $v_{REF-}$. If input bit $b_n$ has a high logic value (i.e., $b_n$='1'), then select circuit 706 provides signal SHIFT, which closes switch 708 during the second portion of the reset interval and opens switch 710 during the second portion of the reset interval, thereby holding the charge on switched-capacitor node $sc_n$ to maintain voltage $v_{REF+}$ on switched-capacitor node $sc_n$.

During interval 3 (i.e., a shift interval) of the digital-to-analog conversion period (e.g., RESET='0' and SHIFT='1'), capacitive digital-to-analog converter 702 shifts the voltage on the output node to an output voltage corresponding to the input digital value. During interval 3, capacitive bit cells that receive a corresponding input bit $b_n$ having a low logic value (i.e., $b_n$='0') continue to open switch 708 and continue to close switch 710, thereby coupling switched-capacitor node $sc_n$ to negative voltage reference node $v_{REF-}$. Those capacitive bit cells do not cause a charge shifting contribution to output node 720 and thus do not affect output voltage $v_{OUT}$. During interval 3, capacitive bit cells that receive a corresponding input bit $b_n$ having a high logic value (i.e., $b_n$='1') open switch 708 and close switch 710, thereby switching switched-capacitor node $sc_n$ from being coupled to positive voltage reference node $v_{REF+}$ to negative voltage reference node $v_{REF-}$. Accordingly, since output node 720 is no longer coupled to reset voltage node $v_{RESET}$, but rather is floating, the voltage on output node 720 shifts to $v_{RESET}-\Delta v_{DAC}'$, where $\Delta v_{DAC}'=(v_{REF+}-v_{REF-})\times C_T/(C_T+C_{OUT})$, and $C_T$ is the sum of capacitances $C_n$ for each bit cell receiving a corresponding input bit $b_n$='1'. As a result, voltage $v_{OUT}$ becomes $v_{RESET}-\Delta v_{DAC}'$, which is an analog value corresponding to the value of input digital code $D_{IN}$. Regardless of the value of a corresponding input bit $b_n$, the capacitive digital-to-analog converter draws the same amount of charge from a voltage reference node (e.g., $v_{REF+}-v_{REF-}$) in each capacitive digital-to-analog converter conversion period. However, that charge may be dumped to ground prior to interval 3 (when input bit $b_n$='0,' thus, not affecting the output voltage) or during the interval 3 (when input bit $b_n$='1,' thus, shifting the output voltage).

Note that each capacitive bit cell 704 may have a different capacitance Cn and may contribute a different voltage to the output voltage when the corresponding input bit $b_n$ is high. For example, the capacitance values of the bit cells may reflect a binary coded input signal or thermometer coded input signal. However, an individual capacitive bit cell 704 receives the same amount of charge from the voltage reference in each conversion period, regardless of the value of the corresponding input bit $b_n$.

Since the voltage reference (e.g., $v_{REF+}-v_{REF-}$) delivers the same amount of charge to capacitive bit cell 704 in each conversion period, capacitive digital-to-analog converter 702 draws a predetermined amount of charge from a voltage reference in each digital-to-analog conversion period in response to any value of the input digital signal in the range of digital values. Thus, if capacitive digital-to-analog converter 702 receives a repetitive digital input code, the number of digital-to-analog converter capacitor units being recharged in each cycle is the same and the DC bias condition on a voltage reference circuit used by the capacitive digital-to-analog converter does not change substantially. Thus, the DC bias on the voltage reference circuit has reduced or negligible dependency on input data. In some embodiments of capacitive digital-to-analog converter 702, some data dependency remains due to different times to deliver charge, but the remaining data-dependency is attenuated as compared to the conventional capacitive digital-to-analog converter described above.

Figure 1:
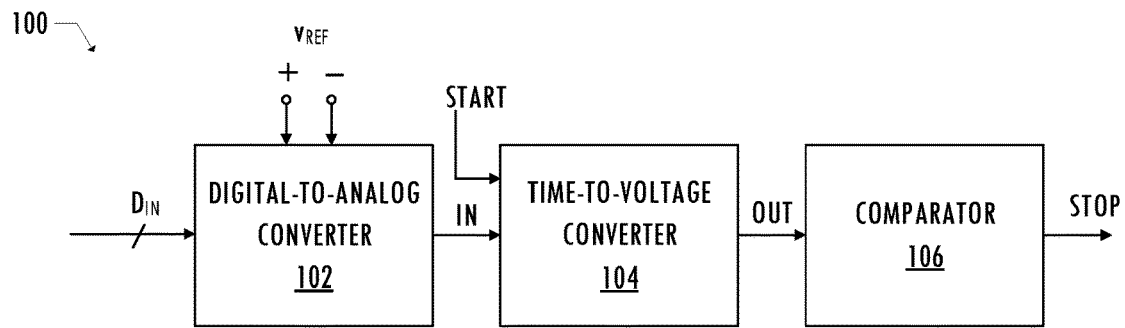
FIG. 1 illustrates a functional block diagram of a conventional digital-to-time converter.
Figure 2:
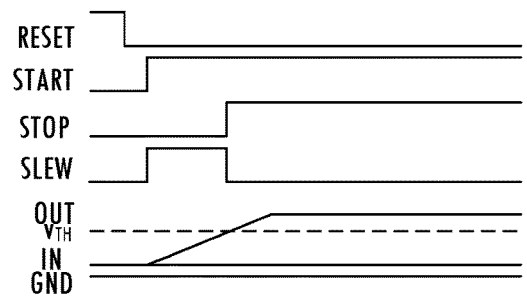
FIG. 2 illustrates exemplary waveforms for the conventional digital-to-time converter of FIG. 1.
Figure 3:
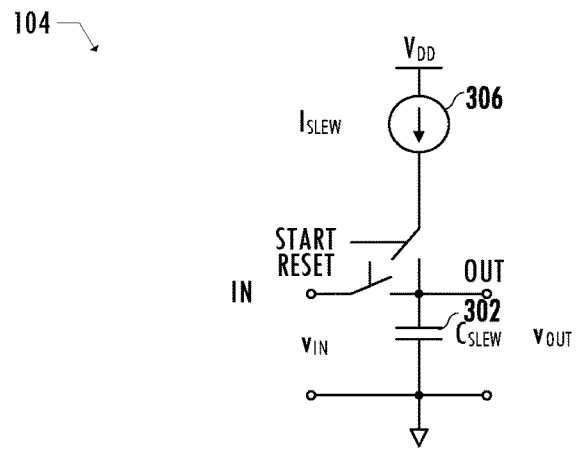
FIG. 3 illustrates a circuit diagram of a conventional time-to-voltage converter for use in the conventional digital-to-time converter of FIG. 1.
Figure 4:
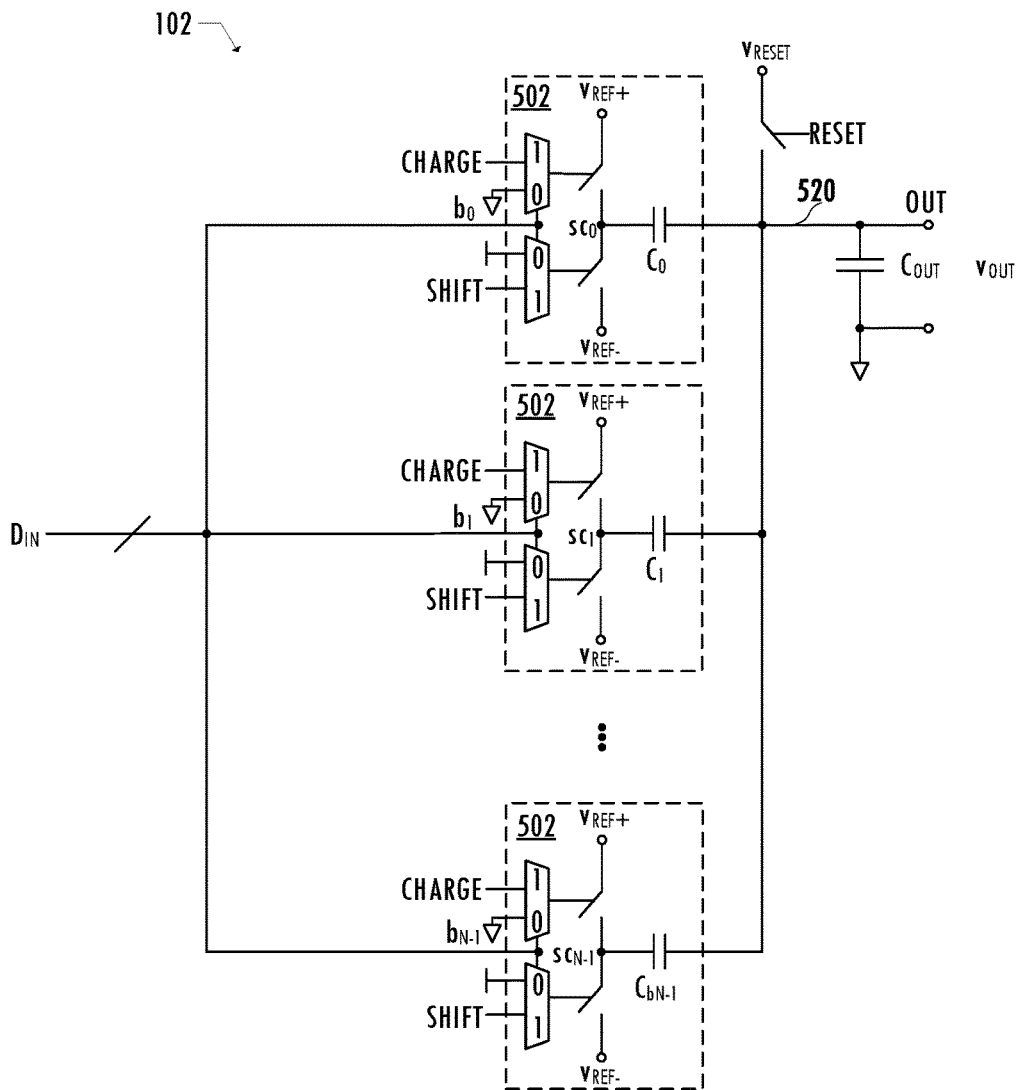
FIG. 4 illustrates a circuit diagram of a conventional capacitive digital-to-analog converter for use in the conventional digital-to-time converter of FIG. 1.
Figure 5:
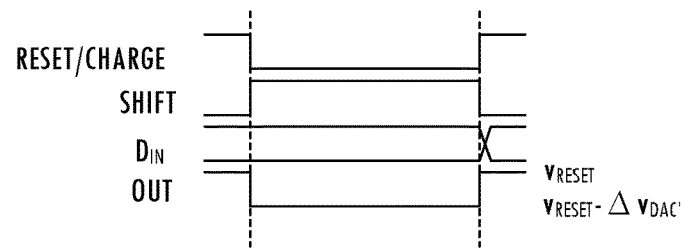
FIG. 5 illustrates exemplary waveforms for the conventional capacitive digital-to-analog converter of FIG. 4.
Figure 8:
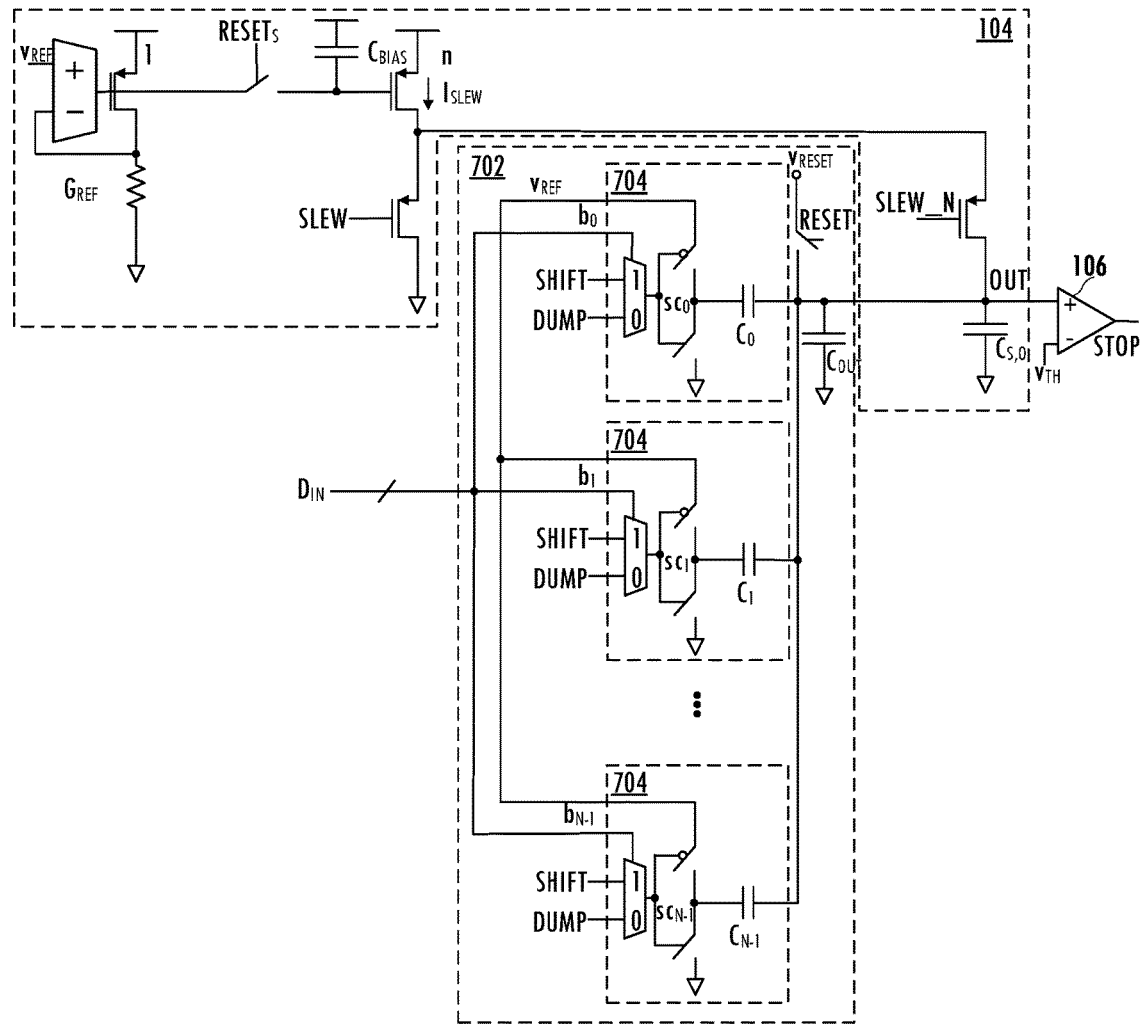
FIG. 8 illustrates a circuit diagram of an exemplary digital-to-time converter using the capacitive digital-to-analog converter of FIGS. 6 and 7.
Figure 9:
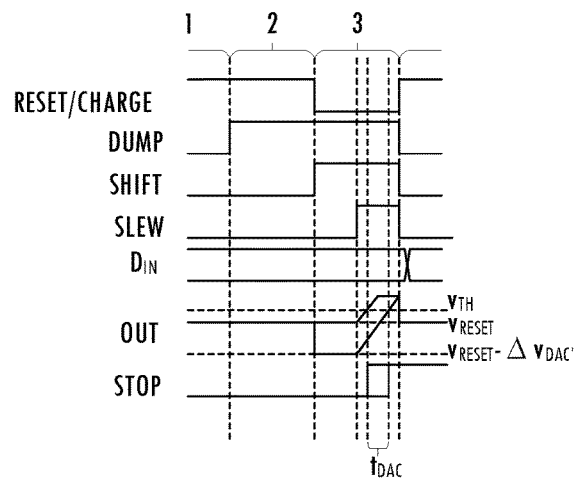
FIG. 9 illustrates exemplary waveforms for the digital-to-time converter of FIG. 8.

Referring to FIGS. 8 and 9, in an exemplary timing application, capacitive digital-to-analog converter 702, time-to-voltage converter 104, and comparator 106 are configured as a digital-to-time converter. The digital-to-time converter generates signal STOP. Signal STOP includes a rising edge having a delay that may be controlled across time range $t_{DAC}$ after the rising edge of signal SLEW would cause comparator 106 to generate a rising edge output. Time range $t_{DAC}$ is the full-scale range of digital-to-analog converter 702. The delay is implemented as an addition of an offset delay. For example, when the input digital code $D_{IN}$ equals zero, digital-to-time converter is configured for its minimum delay, which is a time offset in a digital-to-time transfer characteristic of time delay as a function of input digital code $D_{IN}$. The duration of the interval between the rising edge of signal SLEW and the rising edge of signal STOP corresponds to the value of input digital code $D_{IN}$, as described above with reference to FIGS. 1-3.

The digital-to-time converter of FIGS. 8 and 9 uses intervals of time that guarantee linear operation. For example, a minimum time interval is defined by the current source switching speed and a maximum time interval is defined by the voltage required across the current source to ensure sufficiently high output impedance. The reduced-data dependency of capacitive digital-to-analog converter 702 relaxes a settling time requirement of the voltage reference $v_{REF}$, allowing the resulting digital-to-time converter to generate the output interval at a higher frequency than otherwise achievable using conventional capacitive digital-to-analog converters.

The description of the invention set forth herein is illustrative and is not intended to limit the scope of the invention as set forth in the following claims. For example, while the invention has been described in an embodiment in which capacitive digital-to-analog converters are used in a digital-to-time converter application, one of skill in the art will appreciate that the teachings herein can be utilized in other timing applications. In addition, note that the circuit implementation of capacitive digital-to-analog converter 702 is exemplary only. One of skill in the art will appreciate that the teachings herein can be utilized in other capacitive digital-to-analog converters using functionally equivalent circuits and/or complementary devices. Variations and modifications of the embodiments disclosed herein, may be made based on the description set forth herein, without departing from the scope of the invention as set forth in the following claims.

What is claimed is:

1. A method for reducing data-dependent loading on a voltage reference by a capacitive digital-to-analog converter, the method comprising:
   pre-charging a capacitor of the capacitive digital-to-analog converter to configure the capacitor in a pre-charged state during a first interval;
   selectively discharging the capacitor from the pre-charged state according to a value of an input digital signal to configure the capacitor in a selectively discharged state during a second interval;
   holding an output node of the capacitive digital-to-analog converter at a reset voltage level during the first interval and the second interval, the output node being coupled to a first terminal of the capacitor; and
   discharging any remaining charge on the capacitor and providing an output voltage signal to the output node of the capacitive digital-to-analog converter according to the selectively discharged state during a third interval, the output voltage signal having a voltage level corresponding to the value of the input digital signal.

2. The method, as recited in claim 1, further comprising:
   providing a bias current to the output node during the third interval; and
   generating an output time signal in response to a comparison of the output voltage signal and a threshold voltage level during the third interval.

3. The method, as recited in claim 1, further comprising:
delaying an edge of a clock signal according to an amount of charge on the output node during the third interval.

4. The method, as recited in claim 1,
wherein the pre-charging comprises coupling a second terminal of the capacitor to a first voltage reference node,
wherein the selectively discharging comprises:
coupling the second terminal to a second voltage reference node in response to a first value of the input digital signal; and
coupling the second terminal to the first voltage reference node in response to a second value of the input digital signal, and
wherein discharging the capacitor comprises coupling the second terminal to the second voltage reference node, and
wherein providing the output voltage signal comprises uncoupling the output node from a reset voltage node.

5. The method, as recited in claim 1, further comprising:
selecting a first control signal or a second control signal as a selected control signal based on the input digital signal;
controlling a first switch coupled between a first voltage reference node and a second terminal of the capacitor using the selected control signal; and
controlling a second switch coupled between a second voltage reference node and the second terminal of the capacitor using the selected control signal.

6. The method, as recited in claim 1, wherein loading of the capacitive digital-to-analog converter on the voltage reference of the capacitive digital-to-analog converter is independent of the input digital signal.

7. The method, as recited in claim 1, wherein a digital input code includes the input digital signal and additional input digital signals and an array of capacitors includes the capacitor and additional capacitors, the additional capacitors corresponding to respective input digital signals of the additional input digital signals, the method further comprising:
pre-charging the additional capacitors to configure the additional capacitors in the pre-charged state during the first interval;
selectively discharging the additional capacitors according to corresponding values of the additional input digital signals to configure each of the additional capacitors in a corresponding selectively discharged state during the second interval; and
discharging the additional capacitors and providing a corresponding output voltage signal to the output node of the capacitive digital-to-analog converter for each corresponding selectively discharged state of each of the additional capacitors during the third interval, an output voltage level on the output node corresponding to the value of the digital input code.

8. The method, as recited in claim 1, wherein the capacitive digital-to-analog converter periodically updates the output voltage signal based on the input digital signal and in each digital-to-analog conversion period the voltage reference delivers the same amount of charge to the capacitive digital-to-analog converter.

9. A circuit comprising:
a capacitive digital-to-analog converter configured to convert a digital input code into an output analog signal, the capacitive digital-to-analog converter comprising:
an output node;
a reset voltage node;
a first voltage reference node;
a second voltage reference node;
a switch coupled between the output node and the reset voltage node; and
a switched-capacitor circuit comprising:
a capacitor having a first terminal and a second terminal, the first terminal being coupled to the output node,
wherein the switch and the switched-capacitor circuit are responsive to control signals that configure the switch and the switched-capacitor circuit to:
couple the second terminal of the capacitor to the first voltage reference node during a first interval,
selectively couple the second terminal of the capacitor to the first voltage reference node or the second voltage reference node in response to an input digital signal of the digital input code during a second interval,
couple the second terminal of the capacitor to the second voltage reference node during a third interval, and
couple the output node to the reset voltage node during the first interval and the second interval,
wherein during the third interval, the output analog signal on the output node is configured to have a level corresponding to the digital input code.

10. The circuit, as recited in claim 9, wherein loading of the capacitive digital-to-analog converter on the first voltage reference node is at most negligibly dependent on the digital input code.

11. The circuit, as recited in claim 9, wherein the switched-capacitor circuit further comprises:
a second switch coupled between the second terminal and the first voltage reference node; and
a third switch coupled between the second terminal and the second voltage reference node.

12. The circuit, as recited in claim 11, wherein the switched-capacitor circuit further comprises:
a select circuit configured to select a first control signal or a second control signal as a selected control signal in response to the input digital signal,
wherein the second switch is configured to be responsive to the selected control signal and the third switch is configured to be responsive to a complement of the selected control signal.

13. The circuit, as recited in claim 12, wherein the select circuit provides the first control signal as the selected control signal in response to a first value of the input digital signal and provides the second control signal as the selected control signal in response to a second value of the input digital signal.

14. The circuit, as recited in claim 9, further comprising:
a time-to-voltage converter configured to generate an output voltage signal in response to the output analog signal and a control signal coupled to an additional switch; and
a comparator configured to generate an output time signal in response to a comparison of the output voltage signal and a threshold voltage level of the comparator,
wherein the capacitive digital-to-analog converter, the time-to-voltage converter, and the comparator are configured as a digital-to-time converter.

15. The circuit, as recited in claim 9, wherein the digital input code includes the input digital signal and at least one additional input digital signal, the circuit further comprising:
at least one additional switched-capacitor circuit corresponding to the at least one additional input digital signal, each additional switched-capacitor circuit of the at least one additional switched-capacitor circuit including an additional capacitor having a corresponding first terminal and a corresponding second terminal, the corresponding first terminal being coupled to the output node, wherein each additional switched-capacitor circuit is responsive to control signals to configure each additional switched-capacitor circuit to:
couple the additional capacitor to the first voltage reference node during the first interval,
selectively couple the additional capacitor to the second voltage reference node in response to a corresponding input digital signal of the at least one additional input digital signal during the second interval, and
couple the additional capacitor to the second voltage reference node during the third interval.

16. The circuit, as recited in claim 9, further comprising:
a voltage reference coupled to the first voltage reference node and the second voltage reference node,
wherein loading of the capacitive digital-to-analog converter on the voltage reference of the capacitive digital-to-analog converter is at most negligibly dependent on the input digital signal.

17. The circuit, as recited in claim 9, further comprising:
a voltage reference coupled to the first voltage reference node and the second voltage reference node,
wherein the capacitive digital-to-analog converter periodically updates the output analog signal based on the input digital signal and in each digital-to-analog conversion period the voltage reference delivers the same amount of charge to the capacitive digital-to-analog converter.

18. A method for reducing data-dependent loading on a voltage reference by a capacitive digital-to-analog converter, the method comprising:
periodically updating an output analog signal based on an input digital signal having a range of digital values, wherein the periodically updating includes drawing a predetermined amount of charge by the capacitive digital-to-analog converter from a voltage reference node in each capacitive digital-to-analog conversion period in response to any value of the input digital signal in the range of digital values,
wherein the periodically updating comprises operating the capacitive digital-to-analog converter using at least three non-overlapping intervals in each digital-to-analog conversion period, the at least three non-overlapping intervals including a pre-charge interval, a selective discharge interval, and a shift interval.

19. The method, as recited in claim 18, wherein the periodically updating further comprises:
holding an output node of the capacitive digital-to-analog converter at a reset voltage level during the pre-charge interval and the selective discharge interval, the output node being coupled to a first terminal of a capacitor; and
discharging the capacitor from a selectively discharged state and providing an output voltage signal to the output node of the capacitive digital-to-analog converter according to the selectively discharged state during the shift interval, the output voltage signal having a voltage level corresponding to a value of the input digital signal.

* * * * *